(12) United States Patent
Rodriguez et al.

(10) Patent No.: US 8,794,981 B1
(45) Date of Patent: Aug. 5, 2014

(54) ELECTRICAL CONNECTOR

(71) Applicant: Google Inc., Mountain View, CA (US)

(72) Inventors: Adam Rodriguez, San Francisco, CA (US); Aaron Leiba, San Francisco, CA (US); Jeffrey Hayashida, San Francisco, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/104,294

(22) Filed: Dec. 12, 2013

(51) Int. Cl.
*H01R 12/00* (2006.01)

(52) U.S. Cl.
USPC .......................... 439/76.1; 439/660; 439/606

(58) Field of Classification Search
USPC ........................ 439/76.1, 660, 606
See application file for complete search history.

(56) References Cited

U.S. PATENT DOCUMENTS

| | | | |
|---|---|---|---|
| 4,077,690 A | 3/1978 | Koether | |
| 4,579,404 A * | 4/1986 | Lockard | 439/92 |
| 4,993,975 A | 2/1991 | Asick et al. | |
| 5,278,725 A | 1/1994 | Konno et al. | |
| 5,470,238 A * | 11/1995 | Walden | 439/98 |
| 5,751,544 A | 5/1998 | Song | |
| 5,771,540 A | 6/1998 | Carpenter et al. | |
| 5,941,729 A | 8/1999 | Sri-Jayantha | |
| 6,431,887 B1 | 8/2002 | Yeomans et al. | |
| 6,461,192 B1 | 10/2002 | Kwoka | |
| 6,481,057 B2 | 11/2002 | Lin | |
| 6,860,762 B2 * | 3/2005 | Spykerman et al. | 439/620.08 |
| 7,055,215 B1 | 6/2006 | Ligtenberg et al. | |
| 7,162,388 B2 * | 1/2007 | Johannes et al. | 702/156 |
| 7,247,058 B2 * | 7/2007 | Reeser et al. | 439/701 |
| 7,645,143 B2 | 1/2010 | Rohrbach et al. | |
| 7,984,532 B2 | 7/2011 | Huang | |
| 8,007,315 B2 * | 8/2011 | Whiteman, Jr. | 439/607.05 |
| 8,091,178 B2 | 1/2012 | Degner et al. | |
| 8,608,512 B2 * | 12/2013 | Gross | 439/660 |
| 2004/0253873 A1 * | 12/2004 | Spykerman et al. | 439/620 |
| 2006/0024997 A1 | 2/2006 | Teicher | |
| 2006/0065681 A1 | 3/2006 | Yeh et al. | |
| 2007/0049118 A1 * | 3/2007 | Reeser et al. | 439/608 |
| 2007/0186382 A1 | 8/2007 | Huang | |
| 2010/0151743 A1 * | 6/2010 | Zhou et al. | 439/651 |

(Continued)

FOREIGN PATENT DOCUMENTS

| | | |
|---|---|---|
| EP | 1670101 A1 | 6/2006 |
| EP | 1933259 A1 | 6/2008 |
| WO | 2011/150403 A1 | 12/2011 |

OTHER PUBLICATIONS

"Bare PCB Test Probes", Datasheet, Feb. 16, 2012, 1 page.

(Continued)

*Primary Examiner* — Gary Paumen
(74) *Attorney, Agent, or Firm* — Brake Hughes Bellermann LLP

(57) ABSTRACT

An electrical connector may include a printed circuit board (PCB), the PCB including a plurality of contacts, a plurality of wires coupled to the plurality of contacts on the PCB, a non-conductive pad extending across the PCB, a plurality of pins extending across the non-conductive pad, and an overmold. The plurality of pins may be coupled to the plurality of contacts. The overmold may cover at least a portion of the PCB and at least a first portion of each of the plurality of pins. The overmold may include a first aperture exposing at least a second portion of each of the plurality of pins.

26 Claims, 13 Drawing Sheets

(56) References Cited

U.S. PATENT DOCUMENTS

2010/0330820 A1* 12/2010 Whiteman, Jr. ................ 439/65
2012/0015561 A1 1/2012 Tsai
2013/0115821 A1 5/2013 Golko et al.

OTHER PUBLICATIONS

"Apple Connector", May 15, 2013, 1 page.
"Apple is Granted 6 MacBook Pro Design Patents in Hong Kong", Patently Apple, retrieved on Apr. 16, 2013 from www.patentlapple.com/patently-apple/2013/04/apple-is-granted-6-macbook-pro-design-patents-in-hong-kong.htm, 9 pages.
"Apple Lightning", May 15, 2013, 1 page.
"DisplayPort", from Wikipedia, the free encyclopedia, Sep. 4, 2013, 13 pages.
"HDMI", from Wikipedia, the free encyclopedia, Sep. 4, 2013, 30 pages.
"MacBook Pro (Retina, 15-inch, Early 2013)—Technical Specifications", Mar. 19, 2013, 4 pages.
"Micro USB Plug", May 15, 2013, 1 page.
Schock, "How to Fix a Wobbly Macbook Pro Screen", retrieved from schock.net/articles/2012/02/20/how-to-fix-a-wobbly-macbook-pro-screen/, Feb. 20, 2012, 4 pages.
International Search Report and Written Opinion for International Application No. PCT/US2014/010050, mailed Mar. 28, 2014, 15 pages.

* cited by examiner

US 8,794,981 B1

ELECTRICAL CONNECTOR

TECHNICAL FIELD

This description relates to electrical devices.

BACKGROUND

Electrical devices receive power and/or signals from other electrical devices. Electrical connectors transmit the power and/or signals between electrical devices.

SUMMARY

According to an example embodiment, an electrical connector may include a printed circuit board (PCB), the PCB including a plurality of contacts, a plurality of wires coupled to the plurality of contacts on the PCB, a non-conductive pad extending across the PCB, a plurality of pins extending across the non-conductive pad, and an overmold. The plurality of pins may be coupled to the plurality of contacts. The overmold may cover at least a portion of the PCB and at least a first portion of each of the plurality of pins. The overmold may include a first aperture exposing at least a second portion of each of the plurality of pins.

According to another example embodiment, an electrical connector may include a printed circuit board (PCB) including a plurality of contacts configured to transmit and receive data according to a Universal Serial Bus (USB) communication protocol, a plurality of wires coupled to the plurality of contacts on the PCB, a plurality of pins extending across the PCB and coupled to the plurality of contacts, and an overmold covering at least a portion of the PCB and at least a first end portion of each of the plurality of pins. The overmold may include a first aperture exposing a middle portion of each of the plurality of pins, the electrical connector having a thickness of between 1.0 millimeters and 1.4 millimeters from a top surface of the overmold to an opposing bottom surface of the overmold.

According to another example embodiment, a method of manufacturing an electrical connector may include installing a pad across a printed circuit board (PCB), the pad including a non-conductive material, attaching a plurality of pins to the PCB, the pins extending over the pad and attaching to the PCB in a location adjacent to the pad, the pins comprising a conductive material, covering at least a portion of each of the plurality of pins, and while the portions of each of the plurality of pins are covered, covering the PCB with an overmold.

According to another example embodiment, a method of manufacturing an electrical connector may include covering a portion of a first power node on a printed circuit board (PCB), covering a portion of a second power node, the second power node being on an opposite side of the PCB from the first power node, and while the portions of the first power node and the second power node are covered, covering the PCB with an overmold.

The details of one or more implementations are set forth in the accompanying drawings and the description below. Other features will be apparent from the description and drawings, and from the claims.

DETAILED DESCRIPTION

An electrical connector for carrying power and/or signals between electronic devices may include a plug and a cord. Contacts in the plug may be coupled to wires in the cord. The plug may be inserted into a receptacle of an electronic device, and the plug may be coupled to another electrical and/or electronic device.

The plug may include pins for transmitting the signals, and/or may include power nodes for transmitting the power. The plug may include a non-conductive overmold covering components of the plug other than the pins and/or power nodes, leaving the pins and/or power nodes exposed so they can contact conductive components of the receptacle of the electronic device into which the plug is inserted. The electrical connector may be manufactured by covering the pins and/or power nodes with one or more clamps while covering some or all of the rest of the plug with an overmold. The clamp(s) may prevent the overmold from covering the pins and/or power nodes, leaving the pins and/or power nodes exposed to couple with electrical contacts of the receptacle of the electronic device into which the plug is inserted. A pad and/or bar may have been previously inserted under the pins to prevent the clamp from bending and/or damaging the pins, and/or to maintain a same height of the pins while the clamp is applied to the pins. Examples of the plug are described below.

Figure 1A:
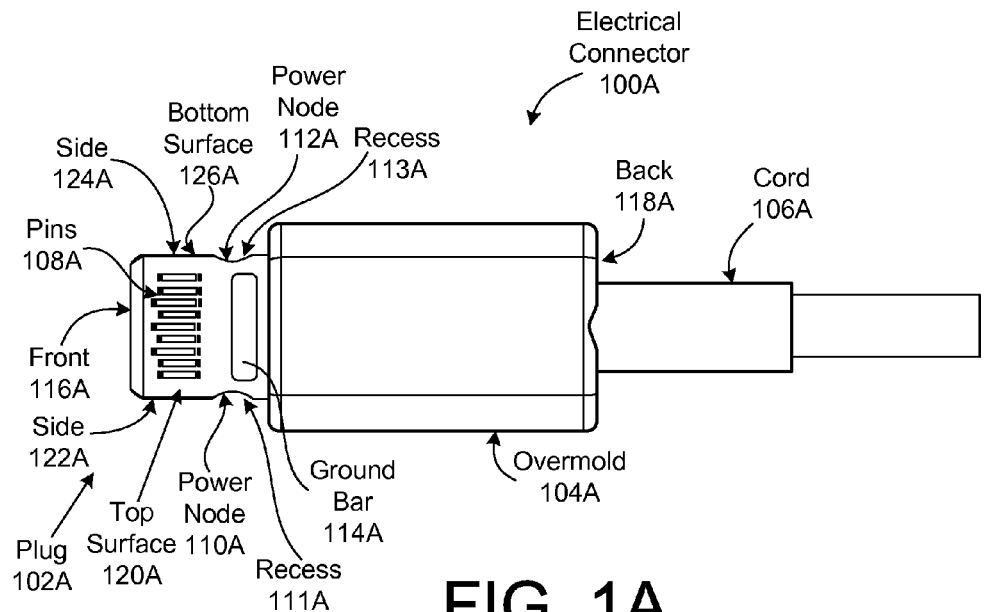
FIG. 1A is a top view of an electrical connector according to an example embodiment.

FIG. 1A is a top view of an electrical connector 100A according to an example embodiment. The electrical connector 100A may include a plug 102A and a cord 106A. The plug 102A may be rectangular prism-shaped, and/or shaped as a parallelepiped, and may have either sharp or tapered edges or vertices.

The plug 102A may include electrical contacts, such as pins 108A and/or power nodes 110A, 112B, coupled to wires (not shown in FIG. 1A) included in the cord 106A. The pins 108A may extend in a row and/or across a plane on a top surface 120A of the plug 102A. The pins 108A may be made of a conductive material such as metal including copper, aluminum, or steel. The pins 108A may transmit and/or receive electrical signals, such as signals according to a Universal Serial Bus (USB) protocol, to and/or from the electronic device into which the plug 102A is inserted. The top surface 120A of the plug 102A along which the pins 108A extend in the row and/or plane may be perpendicular to a front surface 116A of the plug 102A. While nine pins 108A are included in the example plug 102A shown in FIG. 1A, any number of pins 108A may be included in the plug 102A.

The power nodes 110A, 110B may be included in recessed portions 111A, 113A of side portions 122A, 124A of the plug 102A. The power nodes 110A, 110A may be made of a conductive material such as metal including copper, aluminum, or steel. The side portions 122A, 124A in which the power nodes 110A, 110B are included may be on opposite side portions 122A, 124A of the plug 102A. The side portions 122A, 124A in which the power nodes 110A, 110B are included may be perpendicular to both the front surface 116A and the top surface 120A of the plug 102A along which the pins 108A extend in the row and/or plane. The recessed portions 111A, 113A may enable power nodes of the receptacle into which the plug 102A is inserted to secure the plug 102A within the receptacle by frictionally engaging the recessed portions 111A, 113A while coupling to the power nodes 110A, 112A of the plug 102A.

The plug 102A may include a ground bar 114A. The ground bar 114A may be rectangular, and may have either sharp or tapered corners. The ground bar 114A may be made of a conductive material such as metal including copper, aluminum, or steel. The ground bar 114A may couple to a ground node of the receptacle into which the plug 102A is inserted, and may provide grounding to the plug 102A and/or receptacle. The pins 108A, power nodes 110A, 110B, and/or ground bar 114A may be attached and/or coupled to a printed circuit board (PCB) (not shown in FIG. 1A).

The electrical connector 100A may include an overmold 104A. The overmold 104A may enclose and/or surround a portion of the cord 106A that is proximal to, and/or adjacent to, the plug 102A. The overmold 104A may serve as a backstop to the plug 102A, preventing the plug 102A from being inserted into the receptacle beyond a predetermined distance, and/or may protect components of the PCB from being damaged. The overmold 104A may be made of a nonconductive material, such as rubber and/or plastic. The overmold 104A may be applied to the electrical connector 100A by injection molding, according to an example embodiment.

The pins 108A may be distal and/or farther from the cord 106A with respect to the ground bar 114A and/or overmold 104A. The ground bar 114 may be located between the pins 108A and overmold 104A. The overmold 104A may be proximal and/or closer to the cord 106A than the ground bar 114A and/or pins 108A. A thickness of the plug 102A, from the top surface 120A to the bottom surface 126A, may be about 1.2 millimeters, between 1.1 and 1.3 millimeters, and/or between 1.0 and 1.4 millimeters, according to example embodiments.

Figure 1B:
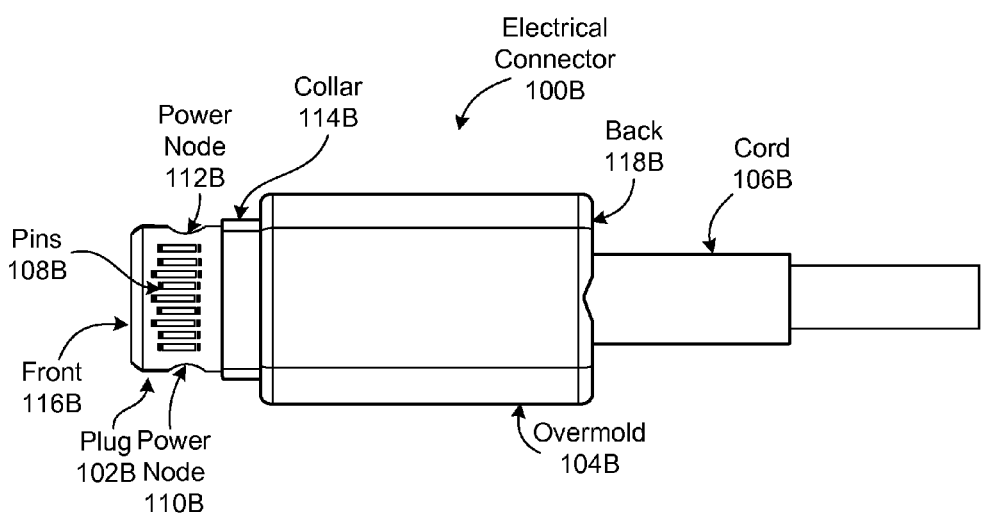
FIG. 1B is a top view of an electrical connector according to another example embodiment.

FIG. 1B is a top view of an electrical connector 100B according to another example embodiment. The electrical connector 100B may include pins 108B which may have similar features to the pins 108A described above with respect to FIG. 1A, power nodes 110B, 112B which may have similar features to the power nodes 110A, 112A described above with respect to FIG. 1A, and an overmold 104B which may have similar features to the overmold 104A described above with respect to FIG. 1A. The plug 102B may also have a similar thickness to the plug 102A.

In an example implementation, the electrical connector 100B may include a collar 114B, but not include a ground bar 114A. The collar 114B may be located between the pins 108B and the overmold 104B. In an example in which the electrical connector 100B includes both the collar 114B and the ground bar 114A (shown in FIG. 1A), the ground bar 114A may be located between the pins 108B and the collar 114B. The collar 114B may be made of a conductive material such as metal including steel, and may serve as a ground for the electrical connector 100B and/or the receptacle into which the plug 102B is inserted. The collar 114B may be placed around the plug 102B, as described below with respect to FIG. 10A.

Figure 2A:
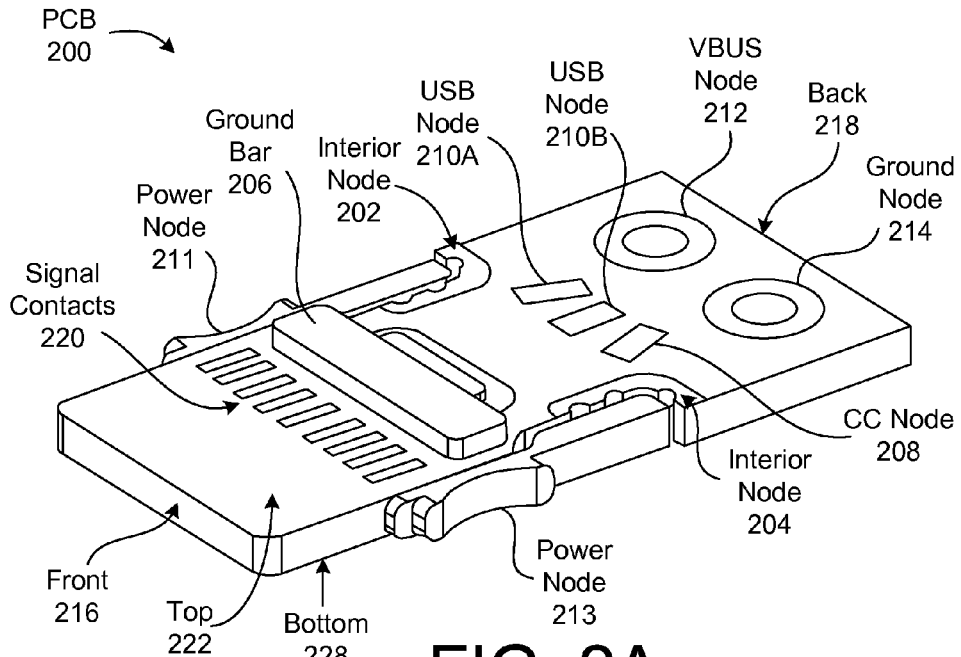
FIG. 2A is a perspective view showing components of either of the electrical connectors of FIG. 1A or FIG. 1B according to an example embodiment.

FIG. 2A is a perspective view showing components of either of the electrical connectors 100A, 100B of FIG. 1A or FIG. 1B according to an example embodiment. The plug 102A, 102B (not shown in entirety in FIG. 2A) and/or electrical connector 100A, 100B (not shown in entirety FIG. 2A) may include a printed circuit board (PCB) 200. A back 218 of the PCB 200 may be closer and/or proximal to the cord 106A, 106B (not shown in FIG. 2A) than a front 216 of the PCB 200. The back 218 and front 216 of the PCB 200 may be closer together than the back 118A, 118B and front 116A, 116B of the plug shown in FIGS. 1A and 1B because the overmold 104A, 104B extends the length of the plug 102A, 102B.

The PCB 200 may include a row of signal contacts 220. The signal contacts 220 may be closer to the front 216 of the PCB 200 than a ground bar 206, USB nodes 210A, 210B, a CC node 208, a VBUS node 212, and a ground node 214. Each of the signal contacts 220 may couple to one of the pins 108A, 108B (not shown in FIG. 2A). Each of the pins 108A, 108B may be attached and/or coupled to one of the signal contacts 220 by, for example, soldering the pin 108A, 108B to the respective signal contact 220. The signal contacts 220 may extend in a row and/or along a plane that extends across a top surface 222 of the PCB. The signal contacts 220 may each be coupled to a wire included in the cord 106A, 106B (not shown in FIG. 2A) by wires inside the PCB 200.

The PCB 200 may also include a row of signal contacts on an opposite side and/or bottom 228 of the PCB 200. The row of signal contacts on the opposite side of the PCB 200 may include a same number of signal contacts as the signal contacts 220 on the top 222 of the PCB 200. The two rows of signal contacts on opposite sides of the PCB 200 may be coupled to each other and to the wires with 180° symmetry, so that if the PCB 200 is rotated 180°, the same wires will be coupled to the same contacts within the receptacle.

The PCB 200 may include interior nodes 202, 204. The interior nodes 202, 204 may be included on the top surface 222 and or a top layer of the PCB 200, near and/or extending to side portions of the PCB 200. The interior nodes 202, 204 may be coupled to power wires included in the cord 106A, 106B, such as via a VBUS node 212 and/or ground node 214. Power nodes 211, 213, which may have similar features to the power nodes 110A, 112A, 110B, 112B described above, may be attached and coupled to the interior nodes 202, 204, such as by soldering the power nodes 211, 213 to the interior nodes 202, 204.

A ground bar 206 may included in, and/or attached to, the PCB 200. The ground bar 206 may have similar features to the ground bar 114A described above with respect to FIG. 1A. The ground bar 114A may be coupled to a ground node 214 on the PCB 200. The ground bar 114A may be coupled to the ground node 214 via one or more wires (not shown) inside the PCB 200. The ground bar 206 may provide grounding to the plug 102A, 102B and/or the receptacle into which the plug 102A, 102B is inserted. The ground bar 206 may couple to a ground node of the receptacle when the plug 102A, 102B is inserted into the receptacle. The plug 102A,102B may also include another ground bar with similar features as, and/or coupled to, the ground bar 206, on an opposite side and/or bottom of the PCB 200 with a same distance from the front 216 of the PCB 200.

The PCB 200 may include signal nodes that are coupled to the signal contacts 220 and connect to signal wires included in the cord 106A, 106B. The signal nodes may be coupled to the signal contacts 220 via internal wires within the PCB 200. In the example shown in FIG. 2A, the signal nodes include universal serial bus (USB) nodes 210A, 210B and a CC node 208. While three signal nodes are shown in the example of FIG. 2A, more or fewer signal nodes may be included in the PCB 200. In an example implementation, the signal nodes may multiplex signals to the signal contacts 220 and/or demultiplex signals from the signal contacts 220 to a device connected to the cord 106A, 106B. Signal wires (not shown in FIG. 2A) may be connected to the signal nodes such as the USB nodes 210A, 210B and CC node 208 by, for example, soldering the signal wires to the signal nodes such as the USB nodes 210A, 210B and CC node 208. The signal wires, USB nodes 210A, 210B, CC node 208, signal contacts 220, and pins 402 may carry, transmit, and/or receive electrical signals according to a Universal Serial Bus (USB) communication protocol.

The PCB 200 may include power nodes that are coupled to the interior nodes 202, 204 and power nodes 211, 213 and connect to power wires (not shown in FIG. 2B) included in the cord 106A, 106B. The power nodes may be circular, with hollow recesses. The power nodes may be coupled to the interior nodes 202, 204 via internal wires within the PCB 200. In the example shown in FIG. 2A, the power nodes include a VBUS node 212 and a ground node 214. While two power nodes are shown in the example of FIG. 2A, more or fewer than two power nodes may be included in the PCB 200. The power wires may be connected to the power nodes such as the VBUS node 212 and ground node 214 by, for example, passing the power wires through the hollow recesses and/or soldering the power wires to the power nodes.

Figure 2B:
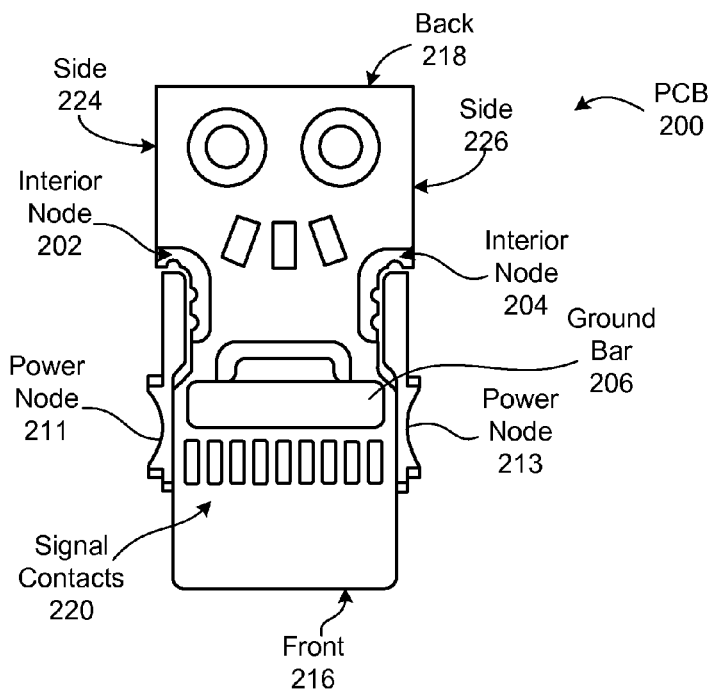
FIG. 2B is a top view showing components of either of the electrical connectors of FIG. 1A or FIG. 1B according to an example embodiment.

FIG. 2B is a top view showing components of either of the electrical connectors 100A, 100B of FIG. 1A or FIG. 1B according to an example embodiment. As shown in FIG. 2B, the signal contacts 220 may be distal to the ground bar 206, and/or located between the ground bar 206 and the front 216 of the PCB 200. The ground bar 206 may be proximal to the signal contacts 220, and/or located between the signal contacts 220 and the back 218 of the PCB 200. The interior nodes 202, 204 may be proximal to the ground bar 206 and/or signal contacts 220, and/or located between the back 218 of the PCB 200 and the ground bar 206 and/or signal contacts 220. The interior nodes 202, 204 may be located on sides 224, 226 of the PCB 200, and may be closer to the back 218 of the PCB 200 than the signal contacts 220. The power nodes 211, 213 may be attached to the interior nodes 202, 204 on the sides 224, 226 of the PCB 200 by, for example, soldering the power nodes 211, 213 to the interior nodes 202, 204.

Figure 3A:
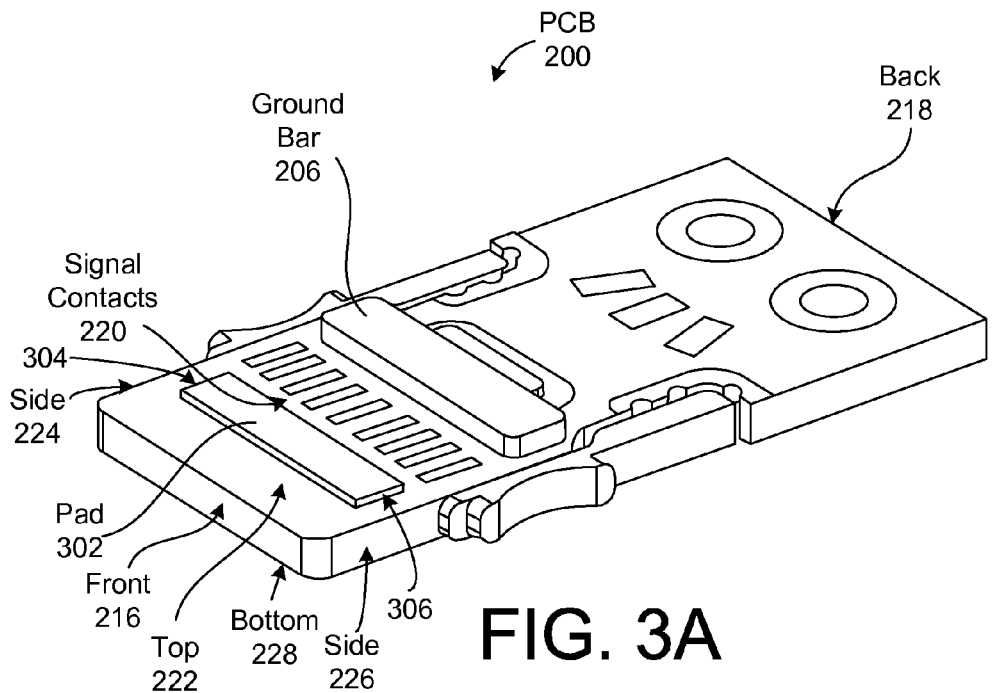
FIG. 3A is another perspective view showing components of either of the electrical connectors of FIG. 1A or FIG. 1B according to an example embodiment.

FIG. 3A is another perspective view showing components of either of the electrical connectors 100A, 100B of FIG. 1A or FIG. 1B according to an example embodiment. In the example shown in FIG. 3A, a pad 302 or bar may be placed on the top surface 222 of the PCB 200 and/or on the top 222 of the PCB between the signal contacts 220 and the front 216 of the PCB 200. The pad 302 may be adjacent to the signal contacts 220 on the top surface 222 of the PCB. The pad 302 may be installed across the PCB 200 to provide a cushion for the pins 108A, 108B (not shown in FIG. 3A). The pad 302 may be secured by the PCB 200 by, for example, an adhesive such as glue or fasteners such as screws or bolts. The pad 302 may be placed on the PCB 200 in a location between the signal contacts 220 and the front 216 of the PCB 200. The pad 302 may be rectangular, with either sharp or tapered corners, according to an example embodiment. According to other example embodiments, the pad 302 may be oval-shaped, or may be irregularly shaped. The pad 302 may extend across the PCB 200 with a distance so that ends 304, 306 of the pad 302 are no farther from, and/or closer to, the sides 224, 226 of the PCB 200 than the signal contacts 220. The pad 302 may be a nonconductive bar made of a nonconductive material, such as rubber or plastic.

A second pad or bar may be installed on an opposite side and/or bottom 228 of the PCB 200 from the pad 302. The second pad or bar may be located on the bottom 228 of the PCB 200 and have similar features to the pad 302.

Figure 3B:
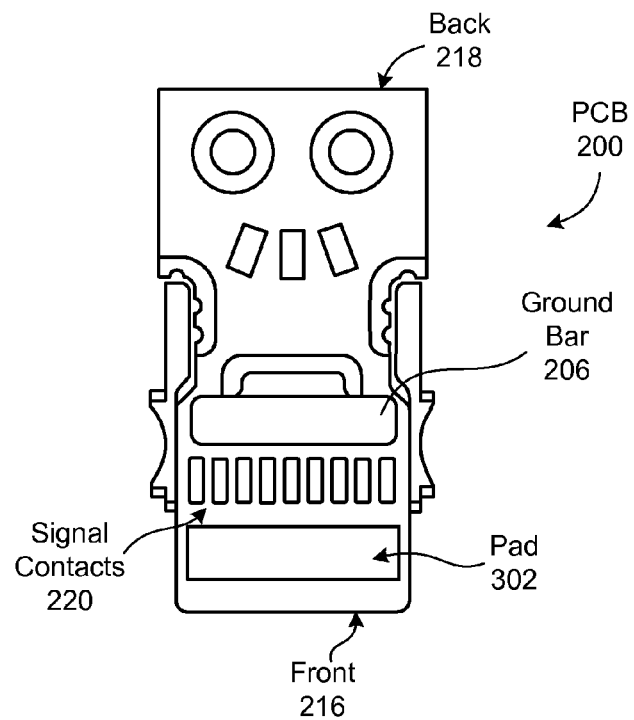
FIG. 3B is another top view showing components of either of the electrical connectors of FIG. 1A or FIG. 1B according to an example embodiment.

FIG. 3B is another top view showing components of either of the electrical connectors 100A, 100B of FIG. 1A or FIG. 1B according to an example embodiment. FIG. 3B shows the pad 302 placed onto the PCB 200.

Figure 4A:
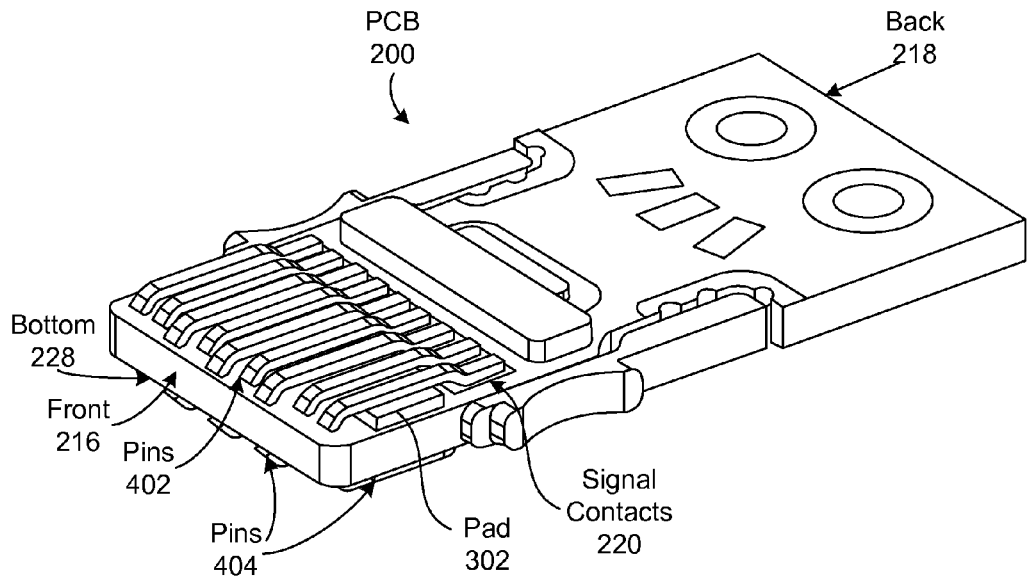
FIG. 4A is another perspective view showing components of either of the electrical connectors of FIG. 1A or FIG. 1B according to an example embodiment.

FIG. 4A is another perspective view showing components of either of the electrical connectors 100A, 100B of FIG. 1A or FIG. 1B according to an example embodiment. In this example, pins 402 have been installed on the PCB 200 across the pad 302. The pins 402 may be similar to the pins 108A, 108B described above with respect to FIGS. 1A and 1B. The pins 402 may be attached to the PCB 200 by attaching the pins 402 to the signal contacts 220. The pins 402 may be electrically coupled and/or attached to the signal contacts 220 by, for example, soldering the pins 402 to the signal contacts 220.

The pins 402 may extend from the signal contacts 220 across the pad 302 to points on the PCB 200 that are located between the pad 302 and the front 216 of the PCB 200. The pins 402 may curve convexly with respect to the PCB 200, and/or middle portions of the pins 402 may be farther from the top surface 222 (not labeled in FIG. 4A) than end portions of the pins 402. In an example embodiment, the pins 402 may form plateaus, with middle portions that are generally parallel to, such as within ten degrees of, the top surface 222, and end portions that slope toward the top surface 222. The pad 302 may cushion the pins 402, preventing the pins 402 from being damaged when a clamp is applied to the pins 402.

Pins 404 may also be installed on an opposite side and/or the bottom 228 of the PCB 200 from the pins 402. The pins 404 may be installed across the second bar described above with respect to FIG. 3A, and may have similar features to the pins 402.

Figure 4B:
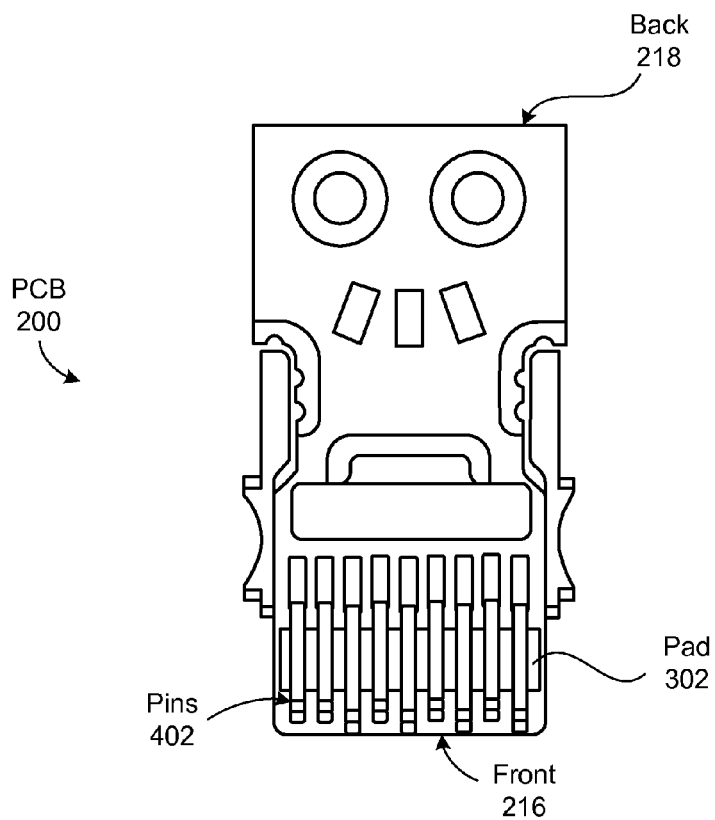
FIG. 4B is another top view showing components of either of the electrical connectors of FIG. 1A or FIG. 1B according to an example embodiment.

FIG. 4B is another top view showing components of either of the electrical connectors 100A, 100B of FIG. 1A or FIG. 1B according to an example embodiment. As shown in FIG. 4B, the pins 402 may extend across the pad 302 with a convex bend with respect to the PCB 200.

Figure 5A:
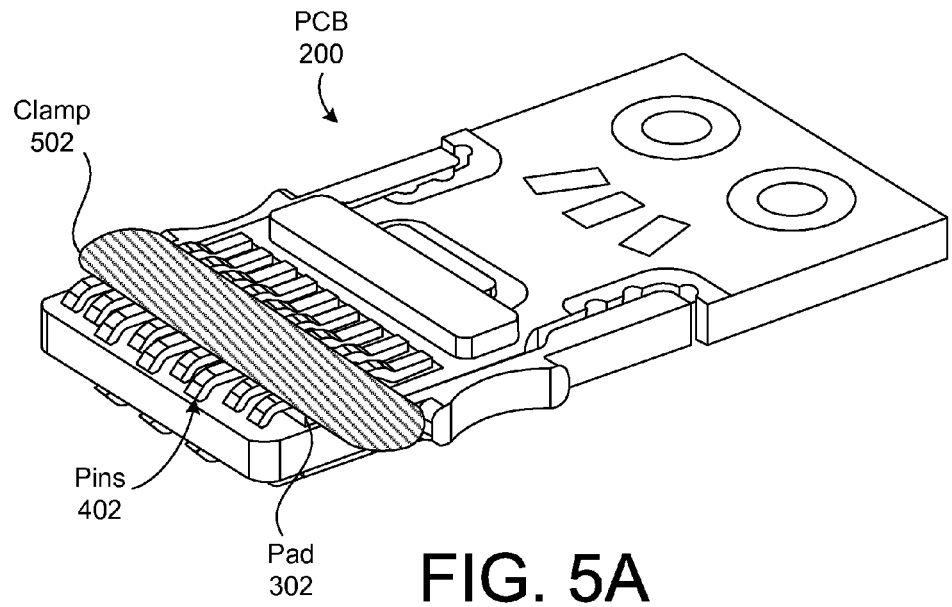
FIG. 5A is a perspective view showing pins of either of the electrical connectors of FIG. 1A or FIG. 1B being covered according to an example embodiment.

FIG. 5A is a perspective view showing pins 402 of either of the electrical connectors of FIG. 1A or FIG. 1B being covered according to an example embodiment. The pins 402 may be partially covered, such as by a clamp 502, to prevent an overmold (not shown in FIG. 5A) from completely covering the pins 402. The clamp 502 may be made of a rigid material, such as metal or plastic. The clamp 502 may have a flat and/or planar surface facing the pins 402. The flat and/or planar surface of the clamp 502 may extend across the middle portions of the pins 402 that plateau, as described above with respect to FIG. 4A. The parts and/or portions of the pins 402 that are covered by the clamp 502 may remain exposed when the overmold is applied to cover the PCB 200.

The pad 302 may prevent the clamp 502 from damaging the pins 402. The pad 302 may, for example, compress in response to pressure from the clamp 502, cushioning the pins 402 from damage. The pad 302 may also maintain a same height of the pins 402 when the clamp 502 is pressing on the pins 402, allowing all of the pins to maintain continuous contact with the clamp 502. Maintaining the same height of the pins 402 and/or continuous contact between the pins 402 and the clamp 502 when the overmold is applied to the PCB 200 may prevent overmold material from being applied to the top of the pins 402 and/or between the pins 402 and the clamp 502.

A clamp may also be applied to portions of the pins 404 (not labeled in FIG. 5A) on the opposite side of the PCB 200 from the pins 402, allowing portions of the pins 404 to also remain exposed when the overmold is applied over the PCB 200. While the tops of the middle portions of the pins 402 remain exposed and are not covered by the overmold, the spaces between the pins 402 may be filled by overmold. The filling of the spaces between the pins 402 by overmold may result in the top of the plug 800 (shown in FIG. 8A) being generally flat. The exposed portions of the pins 402, 404 may contact and/or couple with signaling contacts of the receptacle into which the plug 102A, 102B (not labeled in FIG. 5A) is inserted.

Figure 5B:
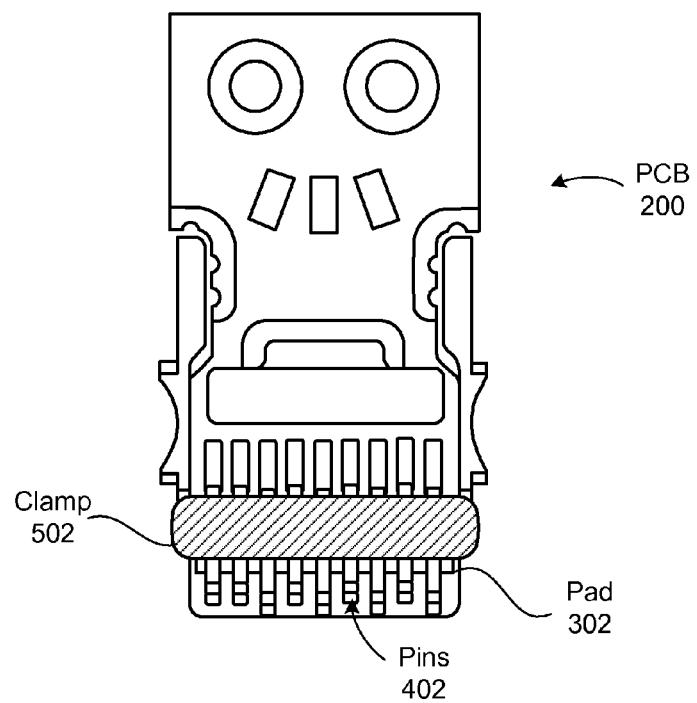
FIG. 5B is a top view showing pins of either of the electrical connectors of FIG. 1A or FIG. 1B being covered according to an example embodiment.

FIG. 5B is a top view showing pins 402 of either of the electrical connectors 100A, 100B of FIG. 1A or FIG. 1B being covered according to an example embodiment. As shown in FIG. 5B, the clamp 502 may cover portions of the pins 402 that extend over the pad 302. The pad 302 may thereby prevent the clamp 502 from damaging the pins 402.

Figure 6A:
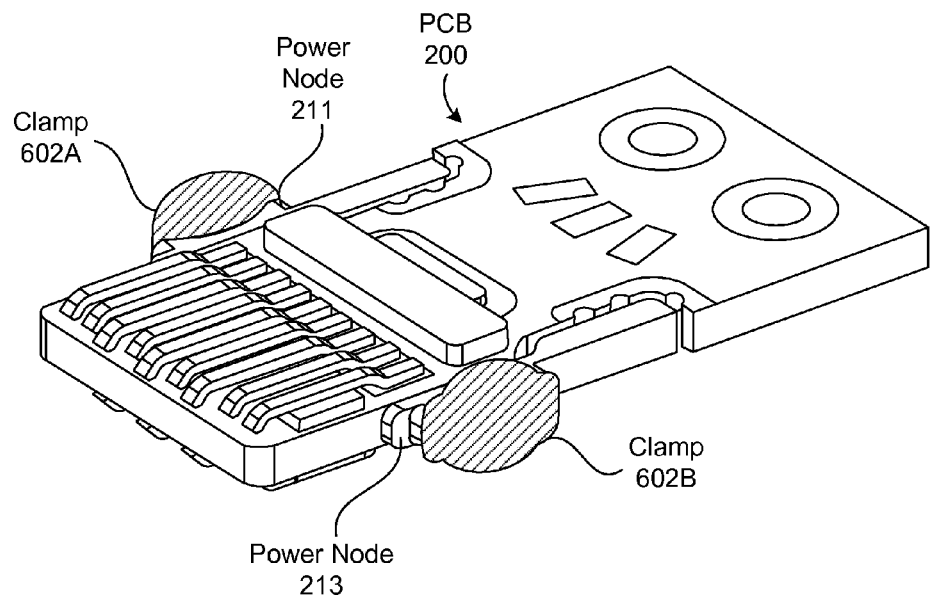
FIG. 6A is a perspective view showing power nodes of either of the electrical connectors of FIG. 1A or FIG. 1B being covered according to an example embodiment.

FIG. 6A is a perspective view showing the power nodes 211, 213 of either of the electrical connectors 100A, 100B of FIG. 1A or FIG. 1B being covered according to an example embodiment. Portions of the power nodes 211, 213 may be covered by clamps 602A, 602B. The clamps 602A, 602B may be made of rigid material, such as metal or plastic. When the overmold (not shown in FIG. 6A) covers the PCB 200, the clamps 602A, 602B may prevent the overmold from covering portions of the power nodes 211, 213, leaving the portions of the power nodes 211, 213 exposed. The exposed portions of the power nodes 211, 213 may contact and transmit power to and/or from power nodes of the receptacle into which the plug 102A, 102B (not labeled in FIG. 6A) is inserted.

Figure 6B:
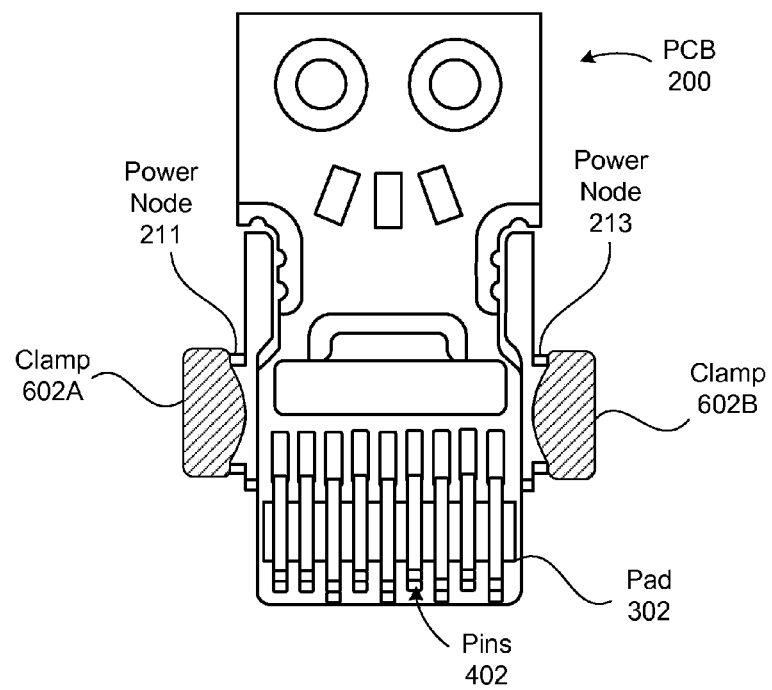
FIG. 6B is a top view showing power nodes of either of the electrical connectors of FIG. 1A or FIG. 1B being covered according to an example embodiment.

FIG. 6B is a top view showing power nodes 211, 213 of either of the electrical connectors of FIG. 1A or FIG. 1B being covered according to an example embodiment. As shown in FIG. 6B, the clamps 602A, 602B may cover portions of the power nodes 211, 213, preventing the overmold from covering the portions of the power nodes 602A, 602B that are covered by the clamps 602A, 602B.

Figure 7A:
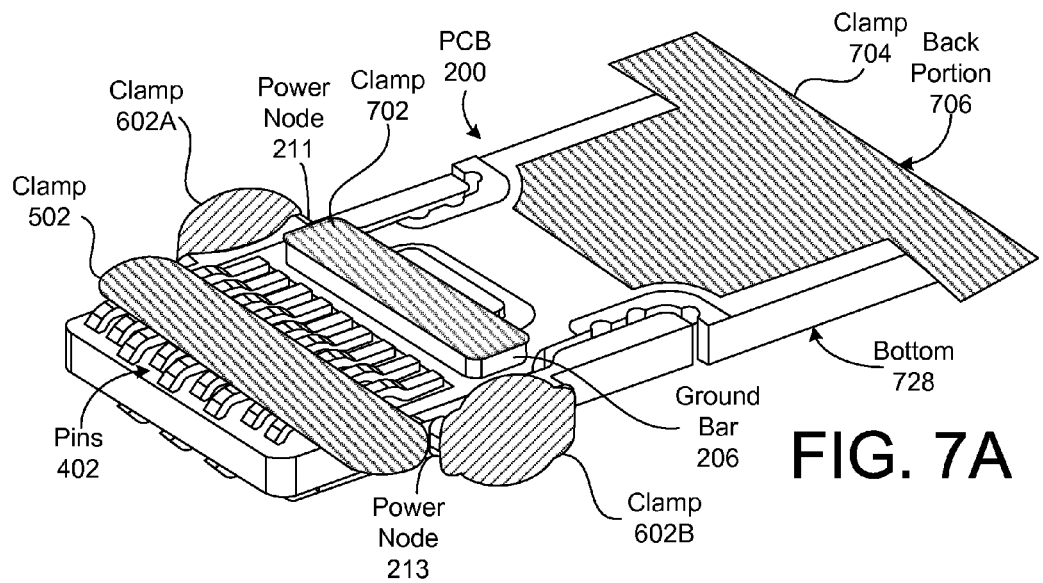
FIG. 7A is a perspective view showing pins, power nodes, a ground bar, and a back portion of a printed circuit board (PCB) of either of the electrical connectors of FIG. 1A or FIG. 1B being covered according to an example embodiment.

FIG. 7A is a perspective view showing the pins 402, power nodes 211, 213, ground bar 206, and a back portion 706 the PCB 200 of either of the electrical connectors 100A, 100B of FIG. 1A or FIG. 1B being covered according to an example embodiment. In this example, the clamp 502 covers the pins 402 as shown and described with respect to FIGS. 5A and 5B, and the clamps 602A, 602B cover the power nodes 211, 213 as shown and described with respect to FIGS. 6A and 6B.

In the example shown in FIG. 7A, a clamp 702 may cover the ground bar 206. The clamp 702 may be made of a rigid material, such as metal or plastic. The covering of the ground bar 206 by the clamp 702 may prevent the overmold from covering the ground bar 206, causing the ground bar 206 to be exposed when the overmold covers the PCB 200. The exposed ground bar 206 may contact and/or couple with a ground node of the receptacle into which the plug 102A, 102B is inserted. Similarly, a clamp 704 or other device may cover a back portion 706 of the PCB 200. The clamp 704 may be made of a rigid material, such as metal or plastic. The covering of the back portion 706 by the clamp 704 or other device may prevent the overmold from covering the back portion 706, which includes the USB nodes 210A, 210B, CC node 208, VBUS node 212, and ground node 214 (which are not shown in FIG. 7A) because they are covered by the clamp 704. The USB nodes 210A, 210B, CC node 208, VBUS node 212, and ground node 214 may thereby be exposed and able to couple to wires in the cord 106A, 106B. Clamps may also cover a ground bar and back portion of the PCB 200 on the bottom 728 of the PCB 200.

Figure 7B:
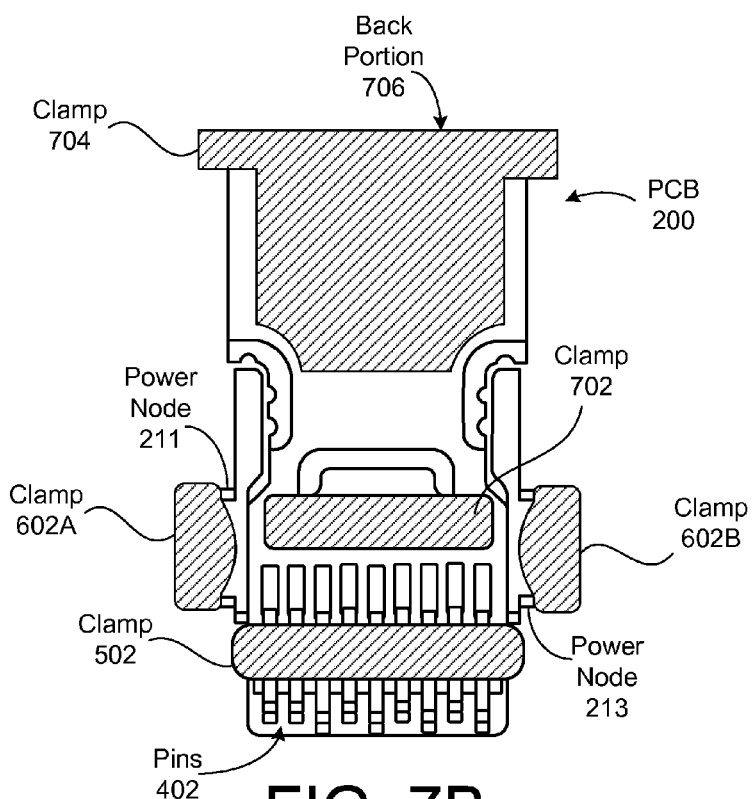
FIG. 7B is a top view showing pins, power nodes, a ground bar, and a back portion of a printed circuit board (PCB) of either of the electrical connectors of FIG. 1A or FIG. 1B being covered according to an example embodiment.

FIG. 7B is a top view showing the pins 402, power nodes 211, 213, ground bar 206 (not shown in FIG. 7B), and back portion 706 of the PCB 200 of either of the electrical connectors 100A, 100B of FIG. 1A or FIG. 1B being covered according to an example embodiment. As discussed above with respect to FIG. 7A, the clamps 502, 602A, 602B, 702, 704 or other devices may cause the pins 402, ground bar 206, power nodes 211, 213, and back portion 706 to be exposed when the overmold covers the PCB 200. After the overmold has been applied and covers the PCB 200, the clamps 502, 602A, 602B, 702, 704 may be removed from the pins 402, ground bar 206, power nodes 211, 213, and back portion 706, leaving the pins 402, ground bar 206, power nodes 211, 213, USB nodes 210A, 210B, CC node 208, VBUS node 212, and ground node 214 exposed.

Figure 8A:
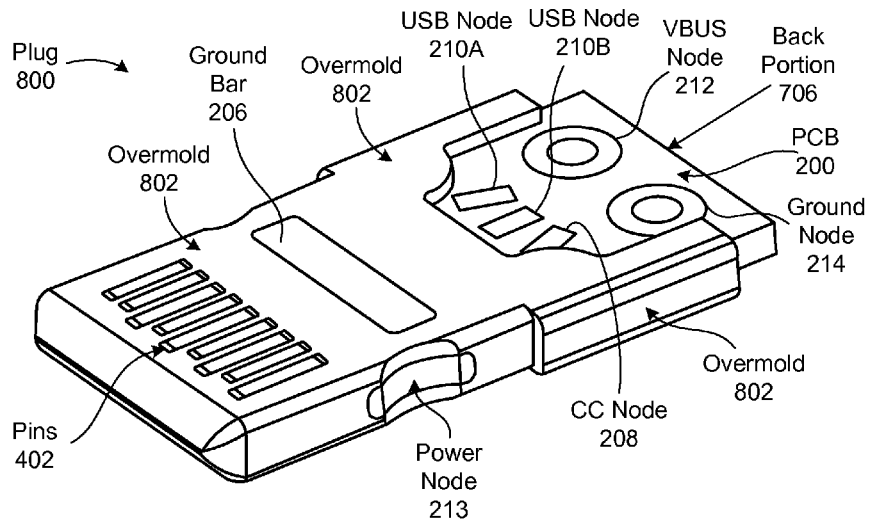
FIG. 8A is a perspective view of a plug included in either of the electrical connectors of FIG. 1A or FIG. 1B according to an example embodiment.

FIG. 8A is a perspective view of a plug 800 included in either of the electrical connectors 100A, 100B of FIG. 1A or FIG. 1B according to an example embodiment. The plug 800 may include features of the plug 102A shown in FIG. 1A and/or the plug 102B shown in FIG. 1B, and may or may not include the ground bar 206. FIG. 8A shows the plug 800 after an overmold 802 has been applied to the PCB 200 and/or after the overmold 802 is covering the PCB 200. The clamps 502, 602A, 602B, 702 may have caused apertures to be formed in the overmold 802, exposing the pins 402, power nodes 211, 213, and ground bar 206. The overmold 802 may be made of a nonconductive material, such as plastic or rubber. The overmold 802 may be applied to the plug 800 by an injection molding process, according to an example embodiment. The plug 800 may have a thickness, from a top surface of the overmold 802 to a bottom surface of the overmold 802, of about 1.2 millimeters, between 1.1 and 1.3 millimeters, and/or between 1.0 and 1.4 millimeters, according to example embodiments.

As shown in FIG. 8A, the overmold 802 does not cover the pins 402, the ground bar 206 (if included in the plug 800), the power nodes 211 (not shown in FIG. 8A), 213, or the back portion 706. Because the overmold 802 does not cover the pins 402, the ground bar 206, the power nodes 211, 213, or the back portion 706, the pins 402, the ground bar 206, the power nodes 211, 213, and the back portion 706 (which includes the USB nodes 210A, 210B, CC node 208, VBUS node 212, and ground node 214) are exposed, allowing these components to couple to corresponding components of the receptacle into which the plug 800 is inserted and/or wires included in the cord 106A, 106B.

Figure 8B:
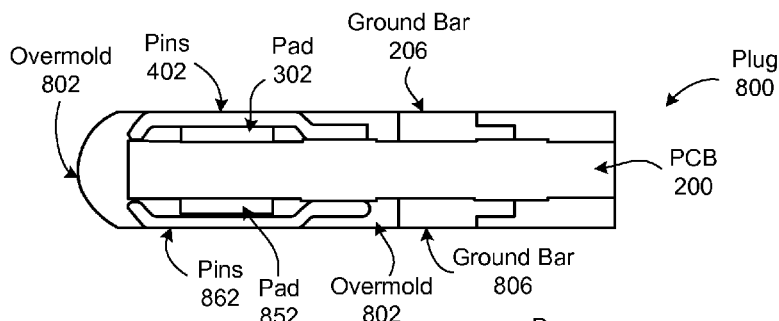
FIG. 8B is a side cross-sectional view of a plug included in either of the electrical connectors of FIG. 1A or FIG. 1B according to an example embodiment.

FIG. 8B is a side cross-sectional view of the plug 800 included in either of the electrical connectors 100A, 100B of FIG. 1A or FIG. 1B according to an example embodiment. As shown in FIG. 8B, the pins 402, 404 extend across their respective pads 302, 852. The overmold 802 extends between the pins 402, 404 and ground bars 206, 806, and in front of the pins 402, 404, but does not cover the pins 402, 404 or ground bar 206, 806.

Figure 8C:
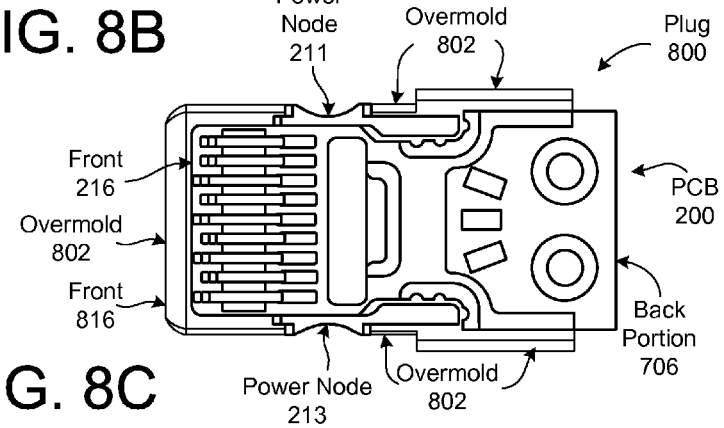
FIG. 8C is a top cross-sectional view of a plug included in either of the electrical connectors of FIG. 1A or FIG. 1B according to an example embodiment.

FIG. 8C is a top cross-sectional view of the plug 800 included in either of the electrical connectors 100A, 100B of FIG. 1A or FIG. 1B according to an example embodiment. As shown in FIG. 8C, the overmold 802 extends along the front 816 of the PCB 200 and forms the front of the plug 800, and extends along the sides of the PCB 200 to forms sides of the plug 800, but does not cover the power nodes 211, 213.

Figure 9A:
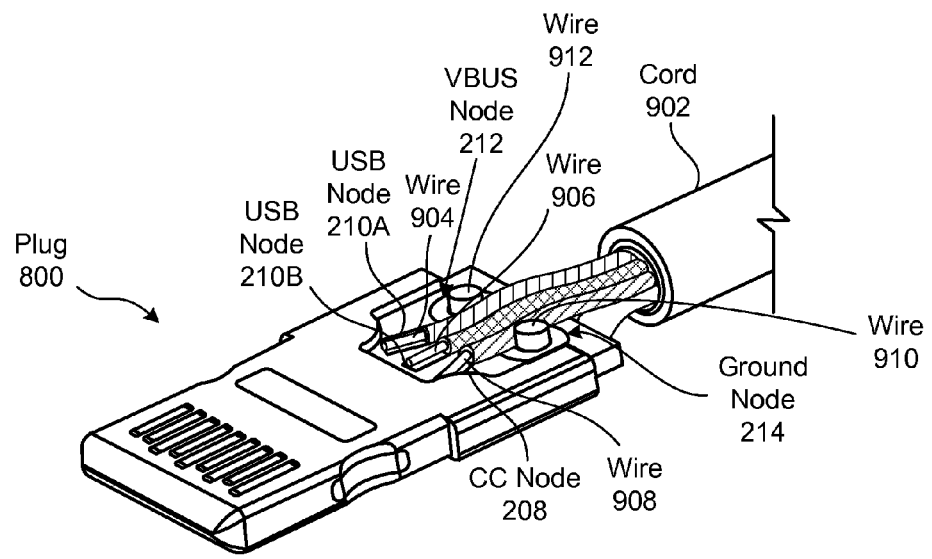
FIG. 9A is a top perspective view of a plug and cord included in either of the electrical connectors of FIG. 1A or FIG. 1B being connected together according to an example embodiment.

FIG. 9A is a top perspective view of the plug 800 and a cord 902 included in either of the electrical connectors 100A, 100B of FIG. 1A or FIG. 1B being connected together according to an example embodiment. The cord 902 may include features of the cord 106A and/or cord 106B described above with respect to FIGS. 1A and 1B. The cord 902 may include a wire 904 coupled to and/or soldered to the USB node 210A, a wire 906 coupled to and/or soldered to the USB node 210B, a wire 908 coupled to and/or soldered to the CC node 208, a wire 910 coupled to and/or soldered to the ground node 214, and/or a wire 912 coupled to and/or soldered to the VBUS node 212.

Figure 9B:
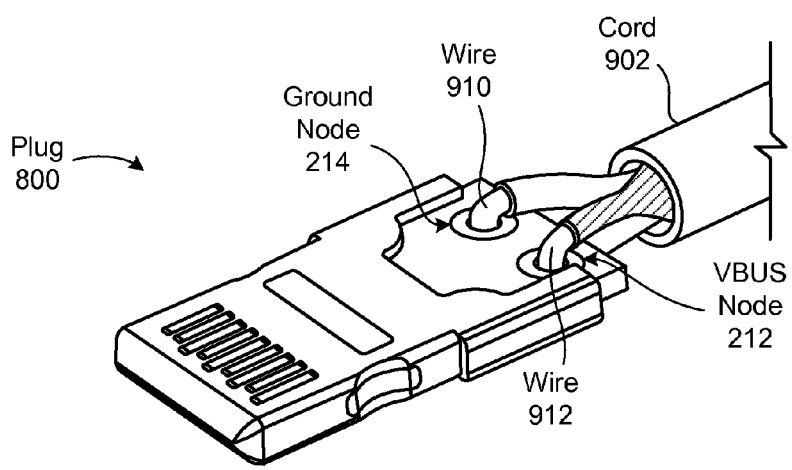
FIG. 9B is a bottom perspective view of a plug and cord included in either of the electrical connectors of FIG. 1A or FIG. 1B being connected together according to an example embodiment.

FIG. 9B is a bottom perspective view of the plug 800 and cord 902 included in either of the electrical connectors 100A, 100B of FIG. 1A or FIG. 1B being connected together according to an example embodiment. As shown in FIG. 9B, the wire 910 may extend through the ground node 214, and the wire 912 may extend through the VBUS node 212.

Figure 10A:
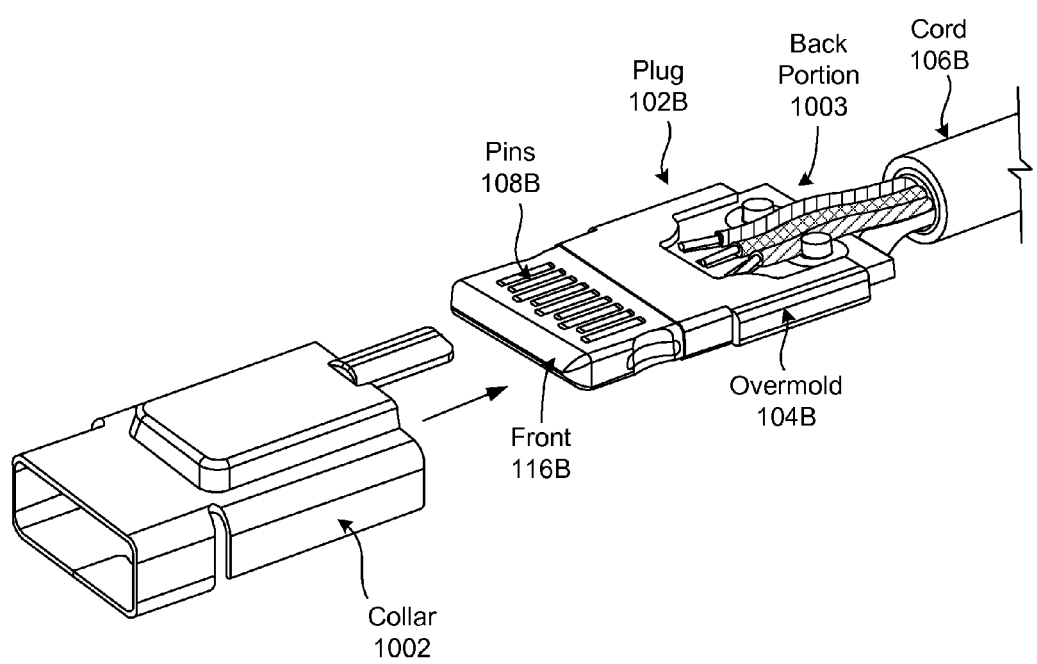
FIG. 10A is a perspective view showing a collar being placed onto the plug of FIG. 1B according to an example embodiment.

FIG. 10A is a perspective view showing a collar 1002 being placed onto the plug 102B of FIG. 1B according to an example embodiment. As shown in FIG. 10A, the collar 1002 may be slid onto the front 116B of the plug 102B after the overmold 104B has been placed onto the plug 102B. The collar 1002 may serve as a ground and a backstop for the plug 102B, and may protect components in the back portion of the plug 102B.

Figure 10B:
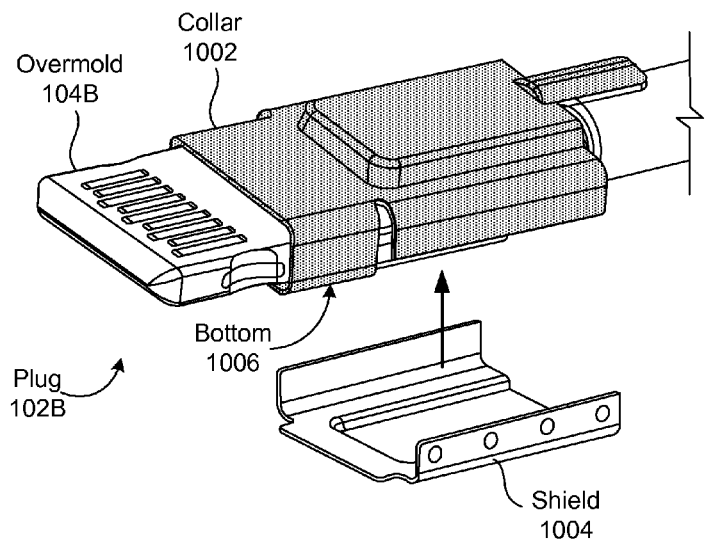
FIG. 10B is a perspective view showing a shield being placed onto the plug and collar of FIG. 10A according to an example embodiment.

FIG. 10B is a perspective view showing a shield 1004 being placed onto the plug 102B and collar 1002 of FIG. 10A according to an example embodiment. The shield 1004 may be slid onto a bottom 1006 of the collar 1002 and plug 102B. The shield 1004 may provide further protection to the plug 102B, preventing components of the plug 102B from being damaged.

Figure 10C:
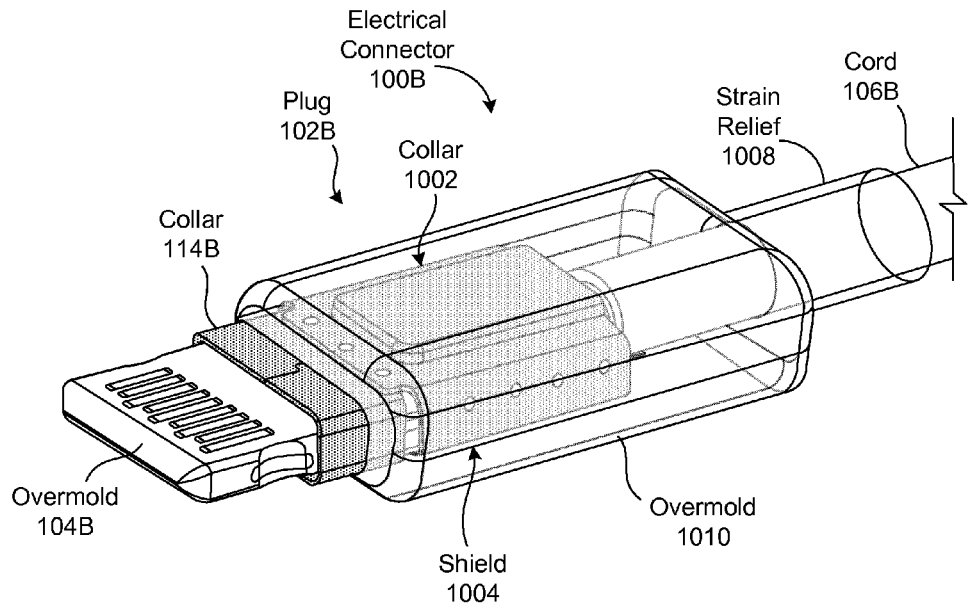
FIG. 10C is a perspective view of the electrical connector of FIG. 10B with an overmold over the plug and a strain relief over the cord according to an example embodiment.

FIG. 10C is a perspective view of the electrical connector 100B of FIG. 10B with an overmold 1010 installed over the plug 102B and a strain relief 1008 over the cord 106B according to an example embodiment. The overmold 1010 may supplement the overmold 104B by covering the collar 1002 and shield 1004, and secure the collar 1002 and shield in place around the plug 102B. The overmold 1010 may be made of a nonconductive material, such as plastic or rubber. The overmold 1010 may be installed over the plug 102B by an injection molding process, according to an example embodiment. A portion of the collar 1002 may extend out of the overmold 1010 in a direction opposite from the cord 106B to form the collar 114B which serves as a ground.

The electrical connector 100B may also include the strain relief 1008. The strain relief 1008 may be made of a flexible material such as plastic or rubber, and may enclose a portion of the cord 106B that extends out of the overmold 1010. The strain relief 1008 may protect the cord 106B from damage when the cord 106B is bent or twisted.

Figure 11:
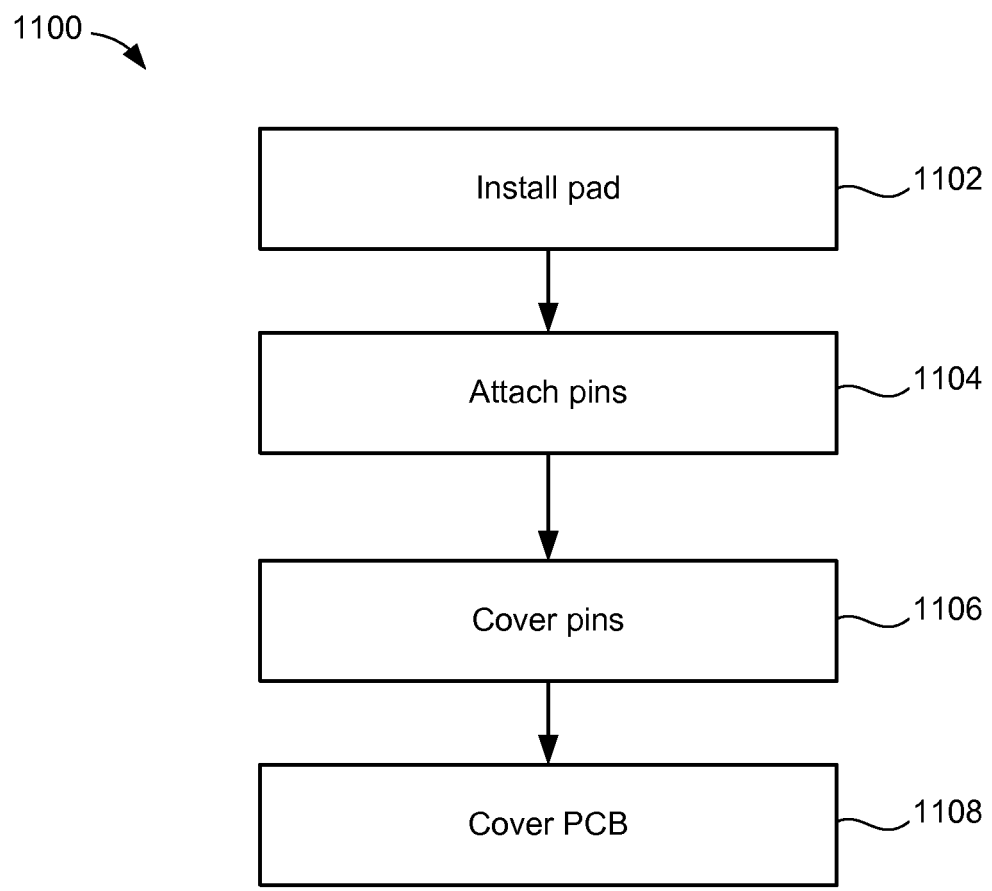
FIG. 11 is a flowchart of a method according to an example embodiment.

FIG. 11 is a flowchart of a method 1100 of manufacturing an electrical connector according to an example embodiment. According to an example embodiment, the method 1100 may include installing a pad across a printed circuit board (PCB), the pad including a non-conductive material (1102), attaching a plurality of pins to the PCB, the pins extending over the pad and attaching to the PCB in a location adjacent to the pad, the pins comprising a conductive material (1104), covering at least a portion of each of the plurality of pins (1106), and while the portions of each of the plurality of pins are covered, covering the PCB with an overmold (1108).

According to an example embodiment, the attaching the plurality of pins (1104) may include soldering the plurality of pins to the PCB.

According to an example embodiment, the plurality of pins may curve convexly with respect to the PCB.

According to an example embodiment, the covering at least the portion of each of the plurality of pins (1106) may include clamping at least the portion of each of the plurality of pins.

According to an example embodiment, the covering at least the portion of each of the plurality of pins (1106) may include clamping at least the portion of each of the plurality of pins with a metal clamp.

According to an example embodiment, the covering the PCB (1108) may include covering the PCB with a nonconductive overmold.

According to an example embodiment, the method 1100 may further include removing the cover from the portions of each of the plurality of pins after covering the PCB with the overmold.

According to an example embodiment, the method 1100 may further include coupling a plurality of wires to a plurality of contacts in the PCB, the plurality of contacts being coupled to the plurality of pins.

According to an example embodiment, the method 1100 may further include covering a portion of a first power node on the PCB, and covering a portion of a second power node, the second power node being on an opposite side of the PCB. The covering the PCB with the overmold (1108) may include covering the PCB with the overmold while the portions of the plurality of pins, the first power node, and the second power node are covered.

According to an example embodiment, the method 1100 may further include sliding a collar over the electrical connector after covering the PCB with the overmold.

According to an example embodiment, the method 1100 may further include attaching a shield to the electrical connector after sliding the collar over the electrical connector.

Figure 12:
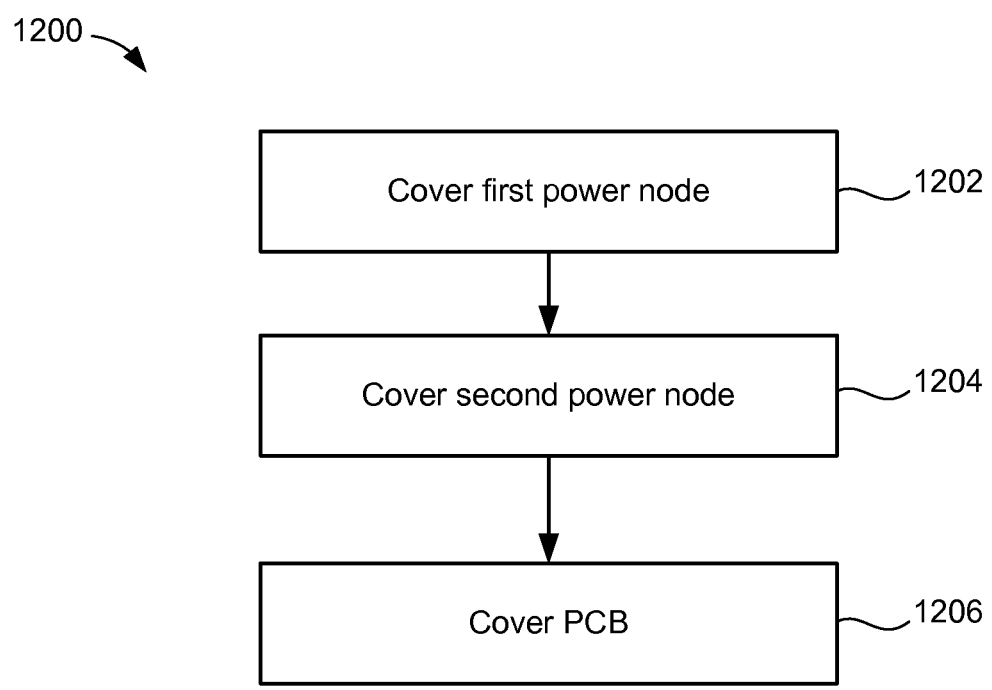
FIG. 12 is a flowchart of a method according to an example embodiment.

FIG. 12 is a flowchart of a method 1200 of manufacturing an electrical connector according to an example embodiment. The method 1200 may include covering a portion of a first power node on a printed circuit board (PCB) (1202), covering a portion of a second power node, the second power node being on an opposite side of the PCB from the first power node (1204), and while the portions of the first power node and the second power node are covered, covering the PCB with an overmold (1206).

According to an example embodiment, the covering the portion of the first power node (1202) and the covering the portion of the second power node (1204) may include clamping the portion of the first power node and the portion of the second power node.

According to an example embodiment, the covering the PCB with the overmold (1206) may include covering the PCB with a nonconductive overmold.

According to an example embodiment, the method 1200 may further include soldering the first power node onto a first interior node, and soldering the second power node onto a second interior node.

According to an example embodiment, the method 1200 may further include removing the cover from the portions of the first and second power nodes after covering the PCB with the overmold.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An electrical connector comprising:
   a printed circuit board (PCB), the PCB including a plurality of contacts;
   a plurality of wires coupled to the plurality of contacts on the PCB;
   a non-conductive pad extending across the PCB;
   a plurality of pins extending across the non-conductive pad, the plurality of pins being coupled to the plurality of contacts; and
   an overmold covering at least a portion of the PCB and at least a first portion of each of the plurality of pins, the overmold including a first aperture exposing at least a second portion of each of the plurality of pins.

2. The electrical connector of claim 1, wherein the non-conductive pad is rectangular prism-shaped.

3. The electrical connector of claim 1, further comprising:
   a first power node attached to the PCB; and
   a second power node attached to the PCB, the second power node being attached to an opposite side of the PCB from the first power node,
   wherein the overmold covers at least a first portion of each of the first power node and the second power node, the overmold including a second aperture exposing at least a second portion of the first power node and a third aperture exposing at least a second portion of the second power node.

4. The electrical connector of claim 1, further comprising a ground bar between the plurality of contacts and the plurality of pins.

5. The electrical connector of claim 1, wherein the plurality of wires and the plurality of pins are configured to transmit and receive signals according to a Universal Serial Bus (USB) communication protocol.

6. The electrical connector of claim 1, wherein:
   the non-conductive pad comprises a first non-conductive pad extending across a top of the PCB;
   the plurality of pins comprises a first plurality of pins extending across the first non-conductive pad;
   the electrical connector further comprises a second non-conductive pad extending across a bottom of the PCB; and
   the electrical connector further comprises a second plurality of pins extending across the second non-conductive pad.

7. An electrical connector comprising:
   a printed circuit board (PCB), the PCB including a plurality of contacts configured to transmit and receive data according to a Universal Serial Bus (USB) communication protocol;
   a plurality of wires coupled to the plurality of contacts on the PCB;
   a plurality of pins extending across the PCB, the plurality of pins being coupled to the plurality of contacts; and
   an overmold covering at least a portion of the PCB and at least a first end portion of each of the plurality of pins, the overmold including a first aperture exposing a middle portion of each of the plurality of pins, the electrical connector having a thickness of between 1.0 millimeters and 1.4 millimeters from a top surface of the overmold to an opposing bottom surface of the overmold.

8. The electrical connector of claim 7, wherein the electrical connector has a thickness of between 1.1 millimeters and 1.3 millimeters.

9. The electrical connector of claim 7, further comprising:
   a first power node attached to a side portion the PCB, the side; and
   a second power node attached to the PCB, the second power node being attached to an opposite side of the PCB from the first power node,
   wherein the overmold covers at least a first portion of each of the first power node and the second power node, the overmold including a second aperture exposing at least a second portion of the first power node and a third aperture exposing at least a second portion of the second power node.

10. The electrical connector of claim 7, further comprising a ground bar between the plurality of contacts and the plurality of pins.

11. A method of manufacturing an electrical connector, the method comprising:
    installing a pad across a printed circuit board (PCB), the pad including a non-conductive material;
    attaching a plurality of pins to the PCB, the pins extending over the pad and attaching to the PCB in a location adjacent to the pad, the pins comprising a conductive material;

covering at least a portion of each of the plurality of pins; and while the portions of each of the plurality of pins are covered, covering the PCB with an overmold.

12. The method of claim 11, wherein the attaching the plurality of pins comprises soldering the plurality of pins to the PCB.

13. The method of claim 11, wherein the plurality of pins curve convexly with respect to the PCB.

14. The method of claim 11, wherein the covering at least the portion of each of the plurality of pins comprises clamping at least the portion of each of the plurality of pins.

15. The method of claim 11, wherein the covering at least the portion of each of the plurality of pins comprises clamping at least the portion of each of the plurality of pins with a metal clamp.

16. The method of claim 11, wherein the covering the PCB comprises covering the PCB with a nonconductive overmold.

17. The method of claim 11, further comprising removing the cover from the portions of each of the plurality of pins after covering the PCB with the overmold.

18. The method of claim 11, further comprising coupling a plurality of wires to a plurality of contacts in the PCB, the plurality of contacts being coupled to the plurality of pins.

19. The method of claim 11, further comprising:
covering a portion of a first power node on the PCB; and
covering a portion of a second power node, the second power node being on an opposite side of the PCB; and
wherein the covering the PCB with the overmold comprises covering the PCB with the overmold while the portions of the plurality of pins, the first power node, and the second power node are covered.

20. The method of claim 11, further comprising sliding a collar over the electrical connector after covering the PCB with the overmold.

21. The method of claim 11, further comprising attaching a shield to the electrical connector after sliding the collar over the electrical connector.

22. A method of manufacturing an electrical connector, the method comprising:
covering a portion of a first power node on a printed circuit board (PCB);
covering a portion of a second power node, the second power node being on an opposite side of the PCB from the first power node; and
while the portions of the first power node and the second power node are covered, covering the PCB with an overmold.

23. The method of claim 22, wherein the covering the portion of the first power node and the covering the portion of the second power node comprises clamping the portion of the first power node and the portion of the second power node.

24. The method of claim 22, wherein the covering the PCB with the overmold comprises covering the PCB with a nonconductive overmold.

25. The method of claim 22, further comprising:
soldering the first power node onto a first interior node; and
soldering the second power node onto a second interior node.

26. The method of claim 22, further comprising removing the cover from the portions of the first and second power nodes after covering the PCB with the overmold.

\* \* \* \* \*